US006562527B2

(12) United States Patent
Ray et al.

(10) Patent No.: US 6,562,527 B2
(45) Date of Patent: May 13, 2003

(54) IMAGED MEMBERS AND METHOD OF PREPARATION THEREOF

(75) Inventors: Kevin Barry Ray, Ft. Collins, CO (US); Hans-Horst Glatt, Munich (DE); Ali Cam, Augsberg (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/932,000

(22) Filed: Aug. 17, 2001

(65) Prior Publication Data

US 2003/0073011 A1 Apr. 17, 2003

(51) Int. Cl.$^7$ .............................. G03F 7/30; G03C 3/00
(52) U.S. Cl. .................... 430/18; 430/175; 430/176; 430/281.1; 430/288.1; 430/313; 430/314; 430/318; 430/323; 430/324
(58) Field of Search ..................... 430/18, 175, 176, 430/281.1, 288.1, 313, 314, 315, 318

(56) References Cited

U.S. PATENT DOCUMENTS

| 5,585,225 A | * 12/1996 | Audett et al. ............... 430/323 |
| 5,698,360 A | 12/1997 | Timpe et al. ............... 430/175 |
| 5,700,619 A | 12/1997 | Baumann et al. ........... 430/175 |
| 5,849,842 A | 12/1998 | Timpe et al. ................. 525/61 |
| 5,925,491 A | 7/1999 | Baumann et al. ........... 430/175 |
| 5,985,996 A | 11/1999 | Baumann et al. ............. 525/59 |

FOREIGN PATENT DOCUMENTS

| EP | 0104863 | 4/1984 |
| EP | 0752430 | 1/1997 |
| EP | 0757061 | 2/1997 |
| EP | 0996037 | 4/2000 |

* cited by examiner

*Primary Examiner*—John S. Chu
(74) *Attorney, Agent, or Firm*—Faegre & Benson LLP

(57) ABSTRACT

A method of manufacturing a selectively relief-treated image member that comprises:

(a) providing a precursor of the image member, the precursor comprising a surface having an image-forming layer comprising a photosensitive resist composition comprising:
 (i) a polymerizable material, and
 (ii) a binder;
(b) delivering radiation image-wise to the precursor;
(c) developing the precursor in a developer in order to selectively remove the image-forming layer in regions to which said radiation was not delivered image-wise in step (b); and
(d) contacting the image-wise exposed precursor with a relief-treatment material, in order to selectively relief-treat regions of the surface of the precursor in which the image-forming layer was removed on development in step (c).

28 Claims, No Drawings

IMAGED MEMBERS AND METHOD OF PREPARATION THEREOF

BACKGROUND OF INVENTION

1. Field of the Invention

This invention relates to methods of preparing relief-treated imaged members and members prepared thereby, using negative working photosensitive compositions.

2. Background Information

Imagable members, such as lithographic printing form precursors, electronic part precursors and mask precursors, conventionally comprise a substrate onto which is coated a film-forming radiation-sensitive composition. After image-wise exposure of the precursor to radiation of suitable wavelength, and development of the imaged precursor, an imaged article is produced.

Negative working imagable members have a radiation sensitive coating, which, when image-wise exposed to radiation of a suitable wavelength, hardens in the exposed areas. On development, the non-exposed areas of the coated compositions are removed, leaving behind the desired image.

The coatings are normally applied as solutions in organic solvents, which are removed by evaporation. Conventionally, ultra-violet or visible radiation has been employed to image compositions sensitive to those wavelengths.

Radiation-sensitive coatings for use in lithographic printing forms desirably have certain physical and chemical properties. In particular in negative working lithographic printing forms the radiation-sensitive coatings employed must be relatively less soluble in a desired developer liquid after exposure with suitable radiation, compared with the pre-exposure solubility of the coating. Furthermore the coatings should desirably have excellent mechanical attrition.

Some negative-working radiation-sensitive compositions used in coatings on lithographic printing forms employ polymers having pendent acetal moieties. Such polymers have been shown to exhibit useful properties when used in conjunction with photosensitive components. The resultant photosensitive compositions, when coated on lithographic printing form precursors, exhibit good developability and mechanical attrition resistance.

EP 752 430 discloses binders for use in lithographic printing plates and precursors. These binders comprise alkyl acetal moieties and carboxylic acid-bearing acetal moieties, and are described as having desirable characteristics for use in coatings on lithographic printing forms.

U.S. Pat. No. 5,700,619 discloses photosensitive compositions comprising the binders of EP 752 430 and a diazonium polycondensation product or free radial polymerizable system, or both. These photosensitive compositions have good development characteristics when used in a coating on a lithographic printing plate precursor.

U.S. Pat. No. 5,925,491 discloses photosensitive compositions comprising a radical polymerizable system and a binder having acetal moieties and amido moieties. The polymeric binders disclosed therein exhibit improved ink acceptance, developability and image resolution when used in coatings on lithographic printing forms.

EP 996 037 discloses binders comprising polyvinyl acetal moieties and imido-substituted acetal moieties, and their use in photosensitive compositions coated onto lithographic printing form precursors. These binders exhibit good adhesion to printing form substrates and good developability and ink acceptance.

U.S. Pat. No. 5,849,842 discloses binders comprising alkyl acetal moieties and sulfonamido substituted acetal moieties, and their use in photosensitive composition used as coatings on lithographic printing form precursors. These binders exhibit good ink acceptance, developability and mechanical attrition resistance, and improve the number of prints produced from the printing form vis-à-vis compositions described in the state of the art.

It has now been found that binders containing pendent acetal and substituted acetal moieties currently used in coatings on lithographic printing forms also exhibit excellent resistance to relief-treatment agents commonly used to relief-treat imaged members such as printed circuit boards (PCBs). Thus binders containing pendent acetal and substituted acetal moieties can be used in photosensitive compositions used as coatings on imagable members which are image-wise exposed and relief-treated, and the coatings exhibit improved relief-treatment agents resistance vis-à-vis prior art relief-treatment agent resistant coatings.

It has also now been found that coatings employing binders containing pendent acetal and substituted acetal moieties may be coated at much lower coating weights compared to prior art coatings used in etch resist applications. Prior art coatings such as the IMAGELINE XV750 coating produced by Coates Circuit Products, the PHOTO-POSIT SN35 Coatings produced by Shirley and the MICROTRACE LIQUID RESIST produced by MacDermid are all coated at weights of around 10 gm$^{-2}$. Coatings of this invention employing binders containing pendent acetal and substituted acetal moieties may be coated at lower weights and still retain excellent relief-treatment agent resistance, after image-wise development of the imagable article. In addition, coatings of this invention also exhibit reduced development times, reduced exposure times, and the need to rub off the unexposed coating after imaging and development is mitigated.

SUMMARY OF THE INVENTION

According to the present invention, a method of manufacturing a selectively relief-treated imaged member comprises:

(a) providing a precursor of the imaged member, the precursor comprising a surface having an image-forming layer comprising a photosensitive resist composition comprising:
 (i) a polymerizable material, and
 (ii) a binder comprising the units A, B, C and D, wherein A is present in an amount of 5 to 80 mole % of the binder and is of the formula:

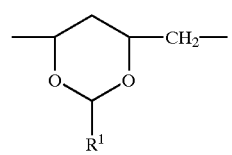

B is present in an amount of 10 to 60 mole % of binder and is of the formula

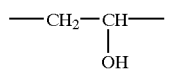

C is present in an amount of 0.1 to 30 mole % of the binder and is of the formula:

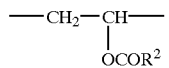

D is present in an amount of 1 to 70 mole % of the binder and is selected from the group consisting of:

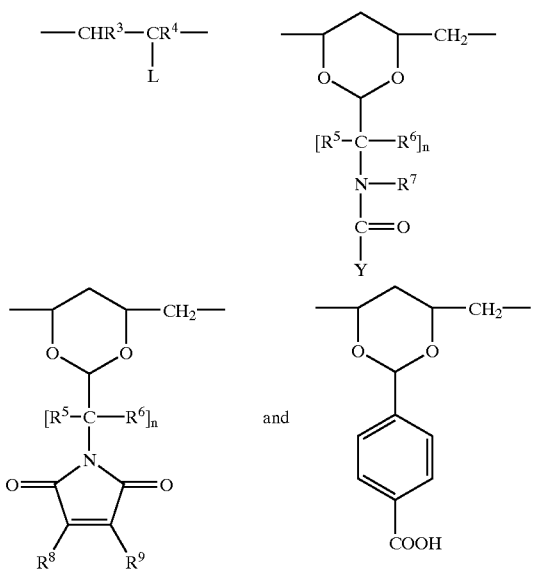

wherein
$R^1$ represents a hydrogen atom, alkyl group, aryl group or alkenyl group,
$R^2$ represents a hydrogen atom or alkyl group,
$R^3$ and $R^4$ are independently selected from a hydrogen atom or an alkyl group,
L represents either the group —NH CO—$R^{12}$—CO—NH—$R^{13}$, wherein $R^{12}$ is selected from a hydrogen atom, an alkyl group, an alkenyl group, or an acryl group, optionally substituted by a carboxyl group, and $R^{13}$ is a $C_1$–$C_6$ hydrocarbon group, optionally substituted by one or more hydroxyl, $C_1$–$C_3$ ether or amino, mono $C_1$–$C_3$ alkyl amino, di-$C_1$–$C_3$ alkylamino or carboxyl groups, or an aryl group having at least one carboxyl or sulfonic acid group,
$R^5$ and $R^6$ are independently selected from a hydrogen atom and an alkyl group and n is an integer from 1 to 3,
$R^7$ is selected from an alkyl group, aryl group or alkenyl group,
$R^8$ and $R^9$ are independently selected from a hydrogen atom or an alkyl group, or $R^8$ and $R^9$, together with the two carbon atoms they are attached to, represent a 5 or 6 membered carbocyclic ring,
Y is selected from the group consisting of OC—Z—COO$R^{10}$ and SO$_2R^{11}$,
wherein $R^{10}$ is selected from a hydrogen atom or an alkyl group,
$R^{11}$ is selected from an alkyl group, an alkenyl group or an aryl group, and Z is a saturated or unsaturated chain or ring-shaped spacer group;
(b) delivering radiation image-wise to the precursor;
(c) developing the precursor in a developer to selectively remove the image-forming layer in regions in which the radiation was not delivered image-wise in step (b); and
(d) contacting the image-wise exposed member with a relief-treatment material, to selectively relief-treat regions of the surface of the member in which the image-forming layer was removed on development in step (c).

DETAILED DESCRIPTION OF THE INVENTION

As used herein, "relief-treatment" refers to any treatment which removes material from or deposits material on a developed precursor in the regions where the image-forming layer has been removed on development. The effect of such a relief-treatment is to form depressions or projections from the plane of the precursor surface.

Suitably the relief-treatment comprises etching and step (c) comprises contacting the image-wise exposed member with an etchant, to selectively etch regions of the surface of the member in which the image-forming layer was removed on development in step (b).

Alternatively the relief-treatment may comprise deposition. A suitable relief-treatment is electrodeposition and in that embodiment step (d) may comprise contacting the image-wise exposed member with an electrodeposition material, to deposit the material on regions of the surface of the member in which the image-forming layer was removed on development in step (c). Preferably the electrodeposition material is a nickel compound, such that nickel is deposited during a galvanic process.

As used herein an "alkyl group" is suitably a $C_1$–$C_{12}$ alkyl group, preferably a $C_1$–$C_6$ alkyl group, most preferably a $C_1$–$C_4$ alkyl group. Alkyl groups having 3 or more carbon atoms may be branched (for example t-butyl) or straight chain (for example n-butyl).

$R^1$ preferably represents a hydrogen atom or $C_1$–$C_4$ alkyl group, preferably a methyl, ethyl or propyl group. Most preferably $R^1$ is a methyl, ethyl or propyl group.

$R^2$ preferably represents a hydrogen atom or $C_1$–$C_4$ alkyl group, preferably a methyl group. $R^2$ is most preferably a methyl group.

$R^3$ preferably represents a hydrogen atom or a $C_1$–$C_4$ alkyl group. $R^3$ is most preferably a hydrogen atom.

$R^4$ preferably represents a hydrogen atom or a $C_1$–$C_4$ alkyl group. $R^4$ is most preferably a hydrogen atom.

$R^5$ preferably represents a hydrogen atom or a $C_1$–$C_4$ alkyl group, preferably a methyl group. $R^5$ is most preferably a hydrogen atom.

$R^6$ preferably represents a hydrogen atom on a $C_1$–$C_4$ alkyl group, preferably a methyl group. $R^6$ is most preferably a methyl group or a hydrogen atom.

$R^7$ preferably a hydrogen atom or $C_1$–$C_4$ alkyl group, preferably a methyl group. Most preferably $R^7$ is a hydrogen atom or methyl group.

$R^8$ is preferably a hydrogen atom or a $C_1$–$C_4$ alkyl group, preferably a methyl group.

$R^9$ is preferably a hydrogen atom or a $C_1$–$C_4$ alkyl group, preferably a methyl group.

$R^{10}$ is preferably a hydrogen atom or a $C_1$–$C_4$ alkyl group. Most preferably $R^{10}$ is a hydrogen atom.

$R^{11}$ is preferably a $C_1$–$C_4$ alkyl group, preferably methyl or a phenyl group.

$R^{12}$ is preferably a hydrogen atom or a $C_1$–$C_4$ alkyl group;

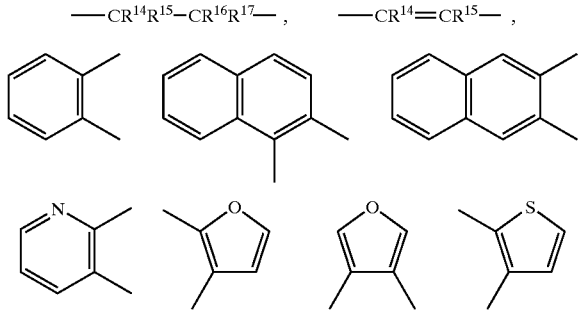

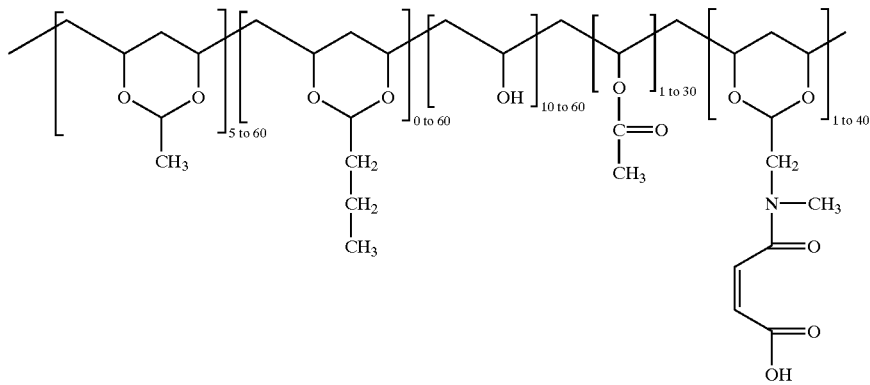

wherein $R^{14}$, $R^{15}$, $R^{16}$, $R^{17}$ are independently hydrogen or alkyl, preferably $C_1$–$C_4$ alkyl. $R^{14}$, $R^{15}$, $R^{16}$, $R^{17}$ are preferably each a hydrogen atom.

The binder may comprise two or more different units of formula (A), wherein in each unit of formula (A), $R^1$ is independently selected from a hydrogen atom, an alkyl group, an aryl group or alkenyl group, and wherein the total amount of units (A) present in the binder is 5 to 80 mole %. Preferably each $R^1$ in the two or more different units of formula (A) is independently a $C_1$–$C_4$ alkyl group, and more preferably at least one $R^1$ is a methyl group.

Preferred binders include:

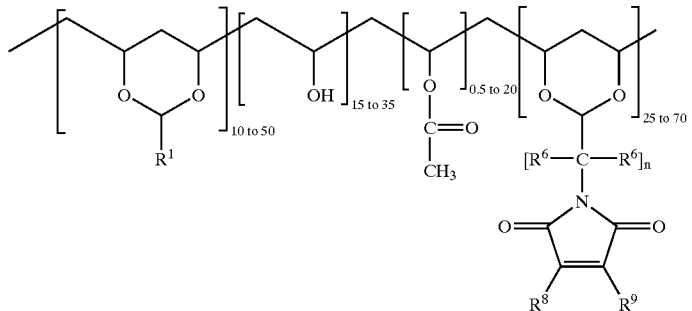

where n is 1–3.
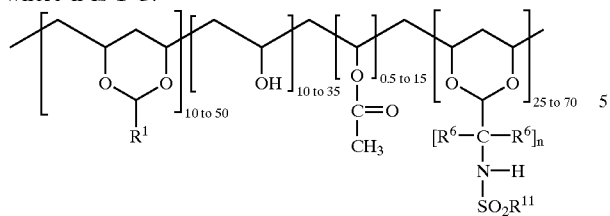
where n is 1–3.
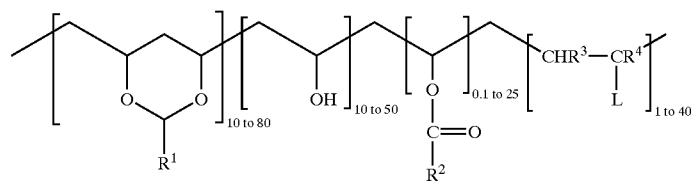
and
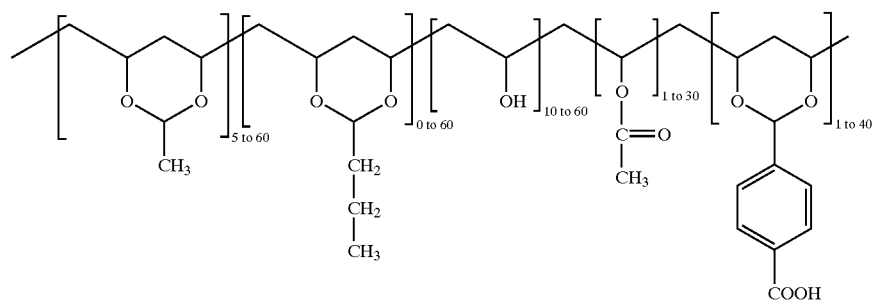
Especially preferred as binders are:
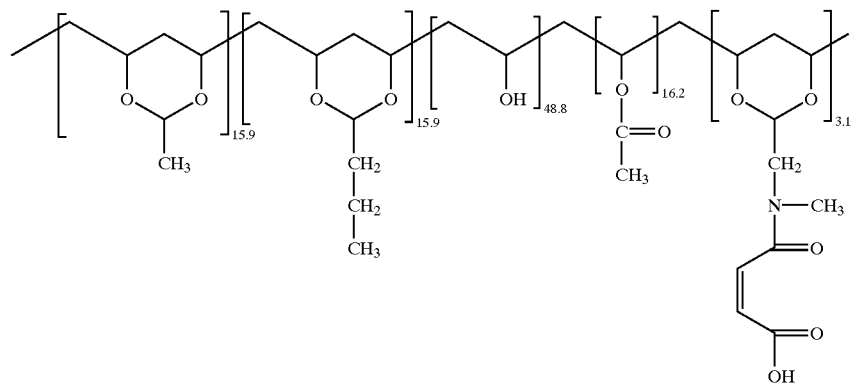
and
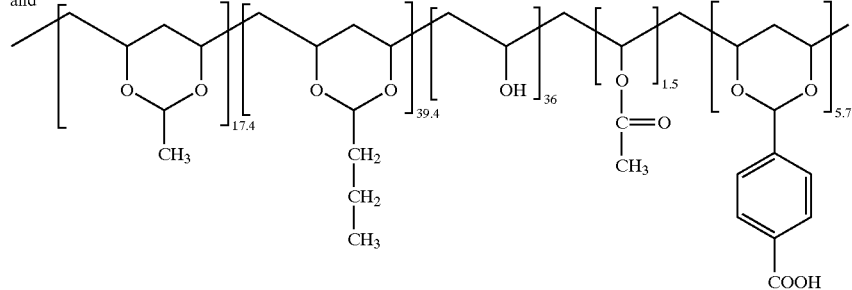

Suitably the binder is present in an amount of not less than 30 wt % of the total weight of the photosensitive composition, preferably not less than 40 wt %, more preferably not less than 50 wt % and most preferably not less than 60 wt %. Suitably the binder is present in an amount of not more than 90 wt % of the total weight of the photosensitive composition, preferably not more than 85 wt %, and more preferably not more than 80 wt %.

Thus, a preferred weight range of the amount of binder is 60–80 wt % of the total weight of the photosensitive composition.

The precursor to the imaged member is suitably a precursor to a letterpress printing form. The surface of the letterpress printing form precursor is suitably a metal (including an alloy) surface. The metal surface may be a magnesium surface, a copper surface, or a zinc surface. Suitable alloy surfaces include steel surfaces or copper alloy surfaces. The surface of the letterpress printing form precursor may be pre-treated before coating with the photosensitive composition by abrading and/or polishing the surface with an abrasive material such as pumice and/or chalk.

The surface of a letterpress printing form precursor may alternatively comprise a laminate of two or more metals and/or alloys, such as a laminate of copper on steel.

When the surface of the letterpress printing form precursor is a steel surface it preferably has a thickness of between 0.3 mm and 10 mm, more preferably around 0.5 mm. When the surface of the letterpress printing form precursor is a copper surface it preferably has a thickness of between 0.5 mm and 3 mm, preferably around 1.5 mm. When the surface of the letterpress printing form precursor is a zinc surface it preferably has a thickness of between 0.8 mm and 7 mm, more preferably between 1.0 mm and 1.7 mm.

The precursor to the imaged member may be a precursor to a decorative article. As used herein, "decorative article" refers to an article which is selectively etched to leave recesses in the surface of the article, such that the recesses may then be inlaid with decorative materials such as colored resins. An example of a preferred decorative article is a damascene.

The surface of the decorative article precursor is suitably a metal (including an alloy) surface, such as a magnesium, copper or zinc surface, or a laminate of two or more metals. Suitable alloy surfaces include steel or copper alloy surfaces.

The imaged member precursor may be an electronic part precursor. The surface of the electronic part precursor may be an insulator which is etched to reveal a conductive or semiconductor layer below. For example it may be silica which is etched to reveal silicon. Alternatively it may be a conductive surface on which a wiring pattern is to be formed, by etching the precursor to remove the conductive surface selectively. Preferably when the surface is conductive it is a copper surface or a surface comprising a copper-rich alloy. Preferably conductive or semi-conductive surfaces are supported by an insulating substrate. The insulating substrate is suitably a dimensionally stable plastics board, for example of epoxy resin reinforced by glass fibres. There may be a conductive surface on one or both sides of the insulating substrate. Preferably the precursor to an electronic part has a metal-insulator-metal structure, especially a copper-insulator-copper structure.

When the electronic part precursor comprises a copper surface or surfaces supported by an insulating substrate, the copper surface or surfaces preferably have a thickness of between 30 μm and 70 μm. More preferably the copper surface has a thickness of around 35 μm.

Preferably the polymerizable material is a diazonium polycondensation product or a free radical polymerizable system comprising photoinitiators and unsaturated compounds which are free radical polymerizable, or a hybrid system of both.

Suitable diazonium polycondensation products useful in the present invention may include diazonium polycondensation products prepared by condensation of a diazo monomer described in EP-104863 with a suitable condensation agent, such as a formaldehyde, acetaldehyde, propionaldehyde, butyraldehyde, isobutyraldehyde or benzaldehyde. The diazonium polycondensation product may further comprise non-photosensitive moieties which are derived from condensable compounds, such as aromatic amines, phenols, phenol ethers, aromatic thioethers, aromatic hydrocarbons, aromatic heterocycles or organic acid amides.

Preferred diazonium polycondensation products are reaction products of diazonium salts, optionally having a methoxy group in the phenyl group bearing the diazo group, with formaldehyde or 4,4'-bis-methoxymethyl diphenyl ether. Suitable anions of the diazonium polycondensation products include aromatic sulfonates, such as 4-tolysulfonate or mesitylene sulfonate, tetrafluoroborate, hexafluorophosphate, hexafluoroantimonate and hexafluoroarsenate. The diazonium polycondensation product is preferably present in the photosensitive composition in an amount from 3 to 60 wt %, more preferably from 20 and 50 wt %, and most preferably from 35 and 45 wt %.

Especially preferred as a diazonium polycondensation product is a compound having the following formula:

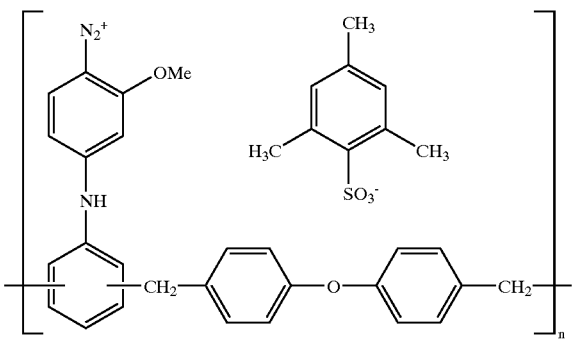

where n is between 1 and 10, preferably between 3 and 6.

Suitable free radical polymerizable systems may comprise photoinitiators absorbing in the range of 300 nm to 800 nm, preferably 300 nm to 450 nm, and free radical polymerizable unsaturated compounds.

Preferred photoinitiators include acetophenone, benzophenone, 1,3,5-(trichloromethyl)-triazine, benzoine, benzoine ethers, benzoine ketals, xanthone, thiozanthone, acridine and hexaryl-bis-imidazole.

Preferred free radical polymerizable unsaturated compounds include acrylic or methyacrylic acid derivatives having one or more unsaturated groups, more preferably esters of acrylic or methacrylic acid in the form of monomers, oligomers or prepolymers. Suitable acrylic and methacrylic acid derivatives having one or more unsaturated groups include trimethylol propane triacrylate, trimethylol propane trimethacrylate, pentaerythritol triacrylate, pentaerythritol trimethacrylate, pentaerythritol tetracrylate, pentaerythritol tetramethacrylate, di(trimethylol propane) tetraacrylate, di(trimethylol propane) tetramethacrylate, dipentaerythrite-mono hydroxy pentacrylate, dipentaerythrite-monohydroxy, pentamethacrylate, dipentaerythritolhexaacrylate, dipentaerythritolhexamethacrylate, diethyleneglycol diacrylate, diethylene glycol dimethacrylate, triethylene glycol diacrylate, triethylene glycol dimethacrylate, epoxide acrylate, epoxide methacrylate, polyester acrylate, polyester methacrylate, polyether acrylate, polyether methacrylate, and unsaturated polyester resins.

There may be more than one photoinitiator and/or free radical polymerizable unsaturated compound present in the photosensitive composition.

The weight range of the total weight of the photoinitiators is preferably 0.5 to 20% and that of the free radical polymerizable unsaturated compounds 5 to 80% based on the total weight of the photosensitive composition.

A combination of one or more diazonium polycondensation products and a free radical polymerizable system comprising one or more photoinitiators and one or more free radical polymerizable unsaturated compounds may be advantageous for certain applications. The composition of such hybrid systems preferably comprise 1 to 50% diazonium polycondensation product, 0.5 to 20% photoinitiator and 5 to 80% free radical polymerizable unsaturated compound.

The photosensitive composition useful in the present invention may also comprise one or more exposure indicators. Suitable exposure indicators include triarylmethane dyes, such as Victoria Blue BO, Victoria Blue R and Crystal Violet, and azo dyes, such as 4-phenyl-azo-diphenylamine, azobenzene or 4,N,N-dimethyl-amino-azo-benzene. Suitably the exposure indicators are present in the photosensitive composition in an amount between 0.02 to 10 wt %, preferably 0.4 to 6wt %.

The photosensitive composition useful in the present invention may further comprise one or more colorants for improving the contrast of the image area. Suitable colorants include rhodamin dyes, methyl violet, anthrachinone pigments and phthalocyanine dyes and/or pigments. Particularly preferred as a colorant is copper phthallocyanine. Suitably the one or more colorants are present in the photosensitive composition in an amount between 0.01 to 15 wt %, preferably 0.3 to 5 wt %.

The photosensitive composition useful in the present invention may comprise one or more stabilizing acids. Suitable stabilizing acids include phosphoric, citric, benzoic, m-nitrobenzoic, p-aniline, azobenzene sulfonic, p-toluenesulfonic or tartaric acid. In some formulations a mixture of several different acids is advantageous. Phosphoric acid is especially preferred. The total amount of the one or more acids is suitably 0.2 to 6 wt % of the total weight of the photosensitive composition.

The photosensitive composition useful in the present invention may also comprise one or more plasticizers. Suitable plasticizers include dibutylphthalate, triaryl phosphate and dioctyl phthalate. Dioctyl phthalate is especially preferred. The total amount of the one or more plasticizers is preferably 0.25 to 2% wt of the total weight of the photosensitive composition.

It has been found that plasticizers such as dibutyl phthalate, triaryl phosphate and dioctyl phthalate also improve the etch resistance and scratch resistance of the photosensitive compositions useful in the present invention.

Other agents, such as siloxanes, may be employed which improve the etch resistance and scratch resistance of the photosensitive compositions of the present invention. Preferred siloxanes are substituted by one or more optionally-substituted alkyl or phenyl groups, and are most preferably phenylalkylsiloxanes or dialkylsiloxanes. Preferred siloxanes have between 10 and 100 —Si($R^1$)($R^2$)O— repeat units. The siloxanes may be copolymerised with ethylene oxide and/or propylene oxide. A particularly preferred siloxane is phenylmethyl siloxane having the formula:

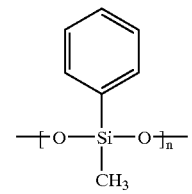

wherein n is between 10 and 50, preferably about 30, which is produced under the trade name SILIKOPHEN P50X by Tego Chemie Service GmbH of Essen, Germany.

Described below in greater detail is the image-wise exposure of the precursor, to radiation, according to the method of this invention. The photosensitive composition coated on the surface of the precursor is such that it is image-wise insolubilised by radiation.

The radiation itself may be emitted image-wise in order to effect image-wise exposure of the precursor. For example the radiation may be emitted image-wise by a laser. The radiation may alternatively be flood emitted through a screen, the screen comprising image and non-image areas, wherein either the image or non-image areas are transparent to the radiation emitted. Alternatively the image-wise exposure of the precursor may be effected indirectly by exposure to radiation transmitted or reflected from the background areas of a graphic original located in contact with the precursor.

In preferred methods of the invention the radiation used to expose the precursor is visible and/or UV radiation. Preferably, the radiation is of wavelength entirely or predominantly exceeding 200 nm, more preferably entirely or predominantly exceeding 300 nm. Preferably it is of wavelength entirely or predominantly below 800 nm, more preferably entirely or predominantly below 450 nm. Thus a preferred wavelength of the radiation used to expose the precursor is 300 nm to 450 nm.

Preferably the sensitivity of the photosensitive composition coated on the precursor is at a practicable level, but is suitably no more that 400 mJcm$^{-1}$, preferably no more that 300 mJcm$^{-1}$.

The radiation may be delivered by any suitable light source such as a xenon lamp, a metallohalogen lamp, a tungsten bulb or a laser, for example an excimer laser.

The developer solubility of the photosensitive composition coated on the surface of the precursor, subjected to image-wise exposure to radiation, is substantially less in exposed regions than unexposed regions. Thus, on development, the unexposed regions of the photosensitive composition may dissolve in the developer, or be removed by rubbing with a suitable wetted article such as a wetted rag or cotton wool pad. Thus, in developed areas, the photosensitive composition is removed, revealing the exposed underlying surface of the precursor.

The exposed surface of the precursor may then be contacted with an etchant, as dictated by step (d) of the method of the present invention. Suitably the precursor is immersed in an etchant liquid. Alternatively the precursor may be passed through a spray comprising an etchant liquid.

The etchant liquid is selected with respect to the material to be etched. For a metallic material, the etchant liquid preferably comprises a solution of ferric chloride, cupric chloride or ammonium persulfate. Particularly preferred etchant liquids are solutions of ferric chloride or cupric chloride, and hydrochloric acid or nitric acid, in water.

The method advantageously further comprises the step of removing the remaining regions of the coating after etching. The remaining regions of the coating may be removed by contacting the precursor with a stripper liquid. Suitable stripper liquids include organic solvents, for example acetone, butanone, ethyl acetate; aromatic solvents such as xylene; or a strong alkali, for example sodium hydroxide or an alkali metal hydroxide.

The method may further comprise baking or UV curing the precursor after development.

Suitably the photosensitive composition is present on the surface of the imaged member precursor in an amount of no more than 5 gm$^{-2}$, preferably no more than 3 gm$^{-2}$, more preferably no more than 2 gm$^{-2}$. Suitably the photosensitive composition is present on the surface of the imaged member precursor in an amount of at least 0.75 gm$^{-2}$, preferably at least 1 gm$^{-2}$ and more preferably at least 1.25 gm$^{-2}$. Thus a preferred weight range of the photosensitive composition on the surface of the imaged member precursor is 1.25 gm$^{-2}$ to 2 gm$^{-2}$.

According to another embodiment of the present invention there is provided an etched imaged member prepared by the method of the first embodiment of the invention.

The following examples more particularly serve to illustrate various embodiments of the present invention described hereinabove:

EXAMPLES

The following products are referred to hereinafter:

Binder N2 (also called T71) as supplied by Freundorfer GmbH, Munich, Germany, believed to have the structure:

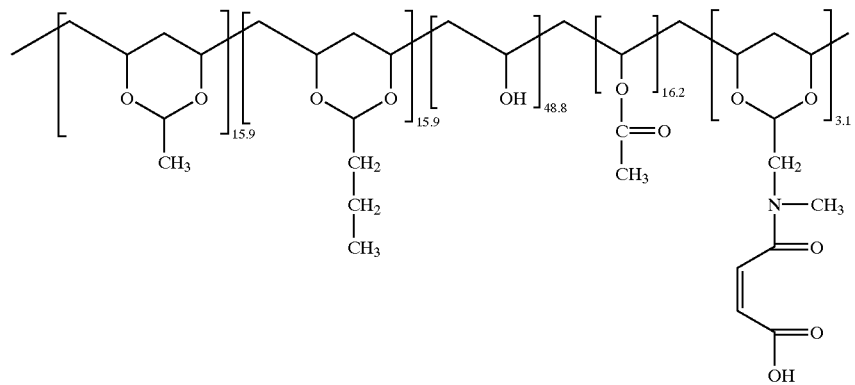

NEGA 107 as supplied by Panchim, Lisses, Cedex, France, having the structure:

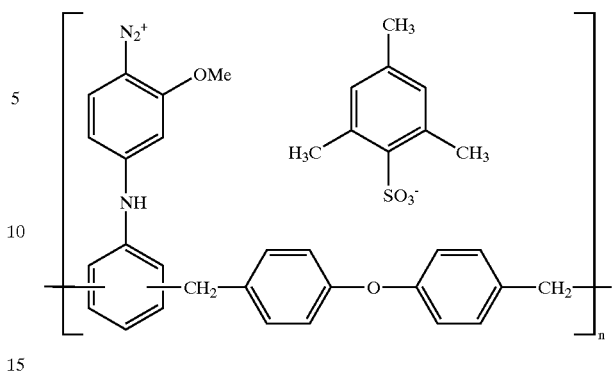

where n is 1–10.

PADA, 4-(Phenylazo) diphenylamine, a printout dye supplied by Panchim, having the structure:

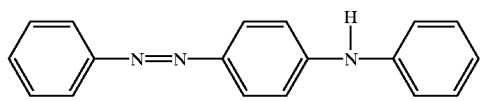

PIG 71, a 13.8% solids dispersion of Binder N2 (6.9%) with Irgalith Blau GLG (Cu phthalocyanine)(6.9%) in methoxypropanol (86.2%), as supplied by Eckart Zulch, Germany.

SILIKOPHEN P50X: phenyl methyl siloxane as supplied by Aldrich Chemical Company, Dorset, UK.

Phosphoric acid as supplied by IMPAG GmbH of Oppenbach, Germany.

Di-octyl phthalate as supplied by Fluka, Dorset, UK.

Developer A: NE620 negative offset developer, as supplied by Freundorfer GmbH, Munich Germany.

Stripper: STRIPPER 10 as supplied by Freundorfer.

Steel substrate: Hardened Steel Strips 17.5×25 cm (tensile strength 1700–1900 N/mm$^2$), as supplied by Sandvik, Sweden.

Zinc substrate: 500×655×1.75 mm, Ra=0.3 µm as supplied by SD Graphics, UK, that had been typically wet polished using a chalk and pumice abrasive mix.

Copper substrate A: polished solid copper plate as supplied by Hück, Germany.

Copper substrate B: double sided copper laminate of overall thickness 254 µm, having copper cladding 18 µm thick on each side of an insulating substrate, catalogue number N4105-2, as supplied by New England Laminates (UK) Ltd of Skelmersdale, UK.

Etchant A: Iron III chloride, 45 Bé, as supplied by Siegwerk Druckfarben, Germany.

Etchant B: sodium persulfate (85%), nitric acid (15%) as supplied by Aldrich.

Protection foil: Type PF 53 SCHWARZ, as supplied by Poli-Film Kunstofftechnik GmbH, Germany.

Example 1

The coating of the formulation for Example 1 was prepared as a solution in methyl glycol (39.6%), methyl ether ketone (MEK) (31.4%) and toluene (29%).

The substrate used was the steel substrate. The coating solution was coated onto one side of the steel substrate using a dipcoater (the substrate was moved in and out of the coating at 33 cm/min, the coating temperature was 20° C. The solution concentration was selected to provide the specified dry film composition with a coating weight of 1.6 to 1.8 gm$^{-2}$ after thorough drying at 90° C. for 10 minutes.

The dry film composition was:

| Component | Parts By Weight |
| --- | --- |
| Binder N2 | 65 |
| NEGA 107 | 9.25 |
| PIG 71 | 24.5 |
| PADA | 0.44 |
| Phosphoric Acid | 0.81 |

The sample of the coated precursor was exposed on a typical vacuum xenon light frame, such that a Stouffer Wedge (21 steps as supplied by Stouffer graphic arts equipment company, USA) reads Full 6, Clear 8, indicating a suitable exposure level for the coating.

The exposed precursor was then processed by immersion in developer A for 60 seconds at 20 to 23° C., with slight agitation of the solution, followed by rinsing for 1 minute with cold water. The precursor was dried with exposure to compressed air followed by 3 minutes in a hotbox oven at 90° C.

The precursor was then etched (uncovered steel removed) in the iron III chloride etchant etchant A), which was constantly being stirred, for 60 seconds at 35° C. in a typical etching processor. The precursor was then rinsed for 1 minute in cold water and dried (in compressed air and hotbox oven as above).

Finally the precursor was cleaned by immersion in stripper with gentle brushing (to remove the remaining UV sensitive coating) at 20° C. for 60 seconds. The etched sample was an accurate copy of the precursor above, after the development stages.

Examples 2 and 3

The coating formulation for Examples 2 and 3 was prepared as a solution in methyl glycol (39.6%), MEK (31.4%) and toluene (29%).

For Example 2, the substrate used was the steel substrate. For Example 3 the substrate used was the zinc substrate. The coating solution was coated onto one side of the applicable substrate using a dipcoater (the substrate was moved in and out of the coating at 33 cm/min, the coating temperature was 20° C.). The solution concentration was selected to provide the specified dry film composition with a coat weight of 1.7 to 2.0 gm$^{-2}$ after thorough drying at 90° C. for 10 minutes.

The dry film composition was:

| Component | Parts By Weight |
| --- | --- |
| Binder N2 | 63.7 |
| NEGA 107 | 9.25 |
| PIG 71 | 24.5 |
| SILIKOPHEN | 1.3 |
| PADA | 0.44 |
| Phosphoric Acid | 0.81 |

Examples 2 and 3 were imaged and developed as described in Example 1.

The precursor from Example 2 was then etched as described in Example 1 above. After stripping (as in Example 1), the etched sample was an accurate copy of the precursor.

Further, an Example 2 sample was etched for 2.5 minutes in the same etchant A. The Example 2 sample also left an accurate copy of the precursor after stripping. This harsh test demonstrated the excellent etch resisting ability of the composition used in the invention.

Another Example 2 sample was etched in etchant B, which was constantly stirred for 60 seconds at 35° C. in a typical etching processor. The sample was rinsed for 1 minute in cold water and dried (in compressed air and hotbox oven as described above). This sample also left an accurate copy of the precursor after stripping (as in Example 1).

The imaged and developed precursor from Example 3 had excellent image discrimination between the unexposed and exposed areas of the resist.

An attempt to assess the "scratch resisting ability" of coated resist samples was made by having a person write a normal signature directly on the surface of the exposed coating (with a medium nib, bic biro pen)and visually observing the coating for scratches and removed debris. A sample of Example 1 was compared to Example 2, and it was observed that there was much less marking on Example 2. This indicates that the presence of SILIKOPHEN P50X improved the scratch resistance ability of the coating.

Example 4

The coating formulation for Example 4 was prepared as a solution in methyl glycol (39.6%), MEK (31.4%) and toluene (29%).

The substrate used was the steel substrate. The coating solution was coated as in Example 1. The solution concentration was selected to provide the specified dry film composition with a coat weight of 1.7 to 2.0 gm$^{-2}$ after thorough drying at 90° C. for 10 minutes.

The dry film composition was:

| Component | Parts By Weight |
| --- | --- |
| Binder N2 | 64.7 |
| NEGA 107 | 9.25 |
| PIG 71 | 24.5 |
| Di-octyl phthalate | 0.3 |
| PADA | 0.44 |
| Phosphoric acid | 0.81 |

The sample of the coated precursor was exposed, developed, etched and stripped as described in Example 1.

The etched sample was an accurate copy of the precursor above, after the development stages. As a measure of the excellent resolution, the 4 micron circles from the Stouffer wedge were present on the finished sample.

Further, an Example 4 sample was etched for 5 minutes in the same etchant A. This sample also left an accurate copy of the precursor after stripping. This very harsh test demonstrated the excellent etch resisting ability of the composition used in the invention.

Examples 5 and 6

The coating formulation for Examples 5 and 6 was prepared as a solution in methyl glycol (39.6%), MEK (31.4%) and toluene (29%).

For Example 5 the substrate used was copper substrate A. For Example 6 the substrate used was copper substrate B. The coating solution was coated as in Example 1. The solution concentration was selected to provide the specified dry film composition with a coat weight of 1.7 to 2.0 gm$^{-2}$ after thorough drying at 90° C. for 10 minutes.

The dry film composition was:

| Component | Parts By Weight |
| --- | --- |
| Binder N2 | 69.47 |
| NEGA 107 | 4.63 |
| PIG 71 | 24.5 |
| Di-octyl phthalate | 0.15 |
| PADA | 0.44 |
| Phosphoric acid | 0.81 |

Samples of the coated precursors from Examples 5 and 6 were exposed, developed, etched and stripped as described in Example 1.

The etched samples were accurate copies of the relevant precursors above. As a measure of the good resolution, the 8 micron circles from the Stouffer wedge were present on the finished samples.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features. It will be understood that the invention described herein is not restricted to the details of the foregoing embodiments.

The invention claimed is:

1. A relief-treated imaged member prepared by a method comprising:

(a) providing a precursor of the imaged member, the precursor comprising a surface having an image-forming layer comprising a photosensitive resist composition comprising:
(i) a polymerizable material, and
(ii) a binder comprising the units A, B, C and D, wherein A is present in an amount of 5 to 80 mole % of the binder and is of the formula:

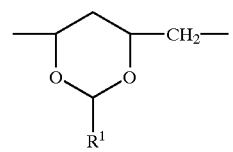

B is present in an amount of 10 to 60 mole % of the binder and is of the formula

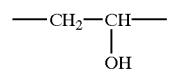

C is present in an amount of 0.1 to 30 mole % of the binder and is of the formula:

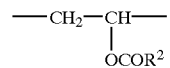

D is present in an amount of 1 to 70 mole % of the binder and is selected from the group consisting of:

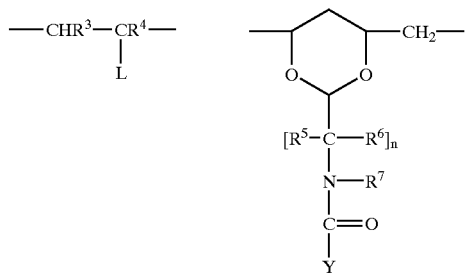

-continued

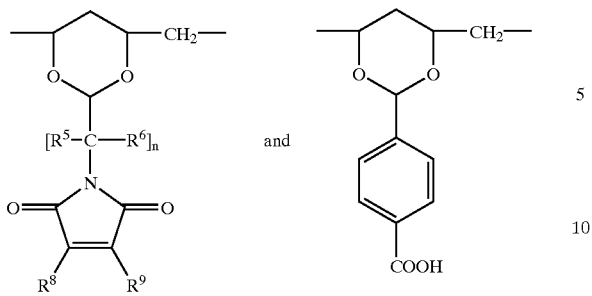

wherein
- $R^1$ represents a hydrogen atom, alkyl group, aryl group or alkenyl group,
- $R^2$ represents a hydrogen atom or alkyl group,
- $R^3$ and $R^4$ are independently selected from a hydrogen atom or an alkyl group;
- L represents either the group —NH CO—$R^{12}$ —CO—NH—$R^{13}$, wherein $R^{12}$ is selected from a hydrogen atom, an alkyl group, an alkenyl group, or an acryl group, optionally substituted by a carboxyl group, and $R^{13}$ is a $C_1$–$C_6$ hydrocarbon group, optionally substituted by one or more hydroxyl, $C_1$–$C_3$ ether or amino, mono $C_1$–$C_3$ alkyl amino, di-$C_1$–$C_3$ alkylamino or carboxyl groups, or an aryl group having at least one carboxyl or sulfonic acid group,
- $R^5$ and $R^6$ are independently selected from a hydrogen atom and an alkyl group and n is an integer from 1 to 3,
- $R^7$ is selected from an alkyl group, aryl group or alkenyl group,
- $R^8$ and $R^9$ are independently selected from a hydrogen atom or an alkyl group, or $R^8$ and $R^9$, together with the two carbon atoms they are attached to, represent a 5 or 6 membered carbocyclic ring,
- Y is selected from the group consisting of OC—Z—COOR$^{10}$ and SO$_2$R$^{11}$,
  - $R^{10}$ is selected from a hydrogen atom or an alkyl group,
  - $R^{11}$ is selected from an alkyl group, an alkenyl group or an aryl group,
  - and Z is a saturated or unsaturated chain or ring-shaped spacer group;

(b) delivering radiation imagewise to the precursor;

(c) developing the precursor in a developer to selectively remove the image-forming layer in regions in which the radiation was not delivered image-wise in step (b); and (d) contacting the image-wise exposed precursor with a relief-treatment material, to selectively relief-treat regions of the surface of the precursor in which the image-forming layer was removed on development in step (c).

2. A method of manufacturing a selectively relief-treated imaged member, the method comprising:

(a) providing a precursor of the imaged member, the precursor comprising a surface having an image-forming layer comprising a photosensitive resist composition comprising:

(i) a polymerizable material, and (ii) a binder comprising the units A, B, C and D, wherein A is present in an amount of 5 to 80 mole % of the binder and is of the formula:

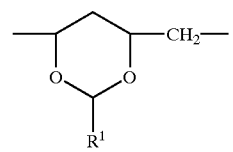

B is present in an amount of 10 to 60 mole % of the binder and is of the formula:

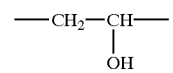

C is present in an amount of 0.1 to 30 mole % of the binder and is of the formula:

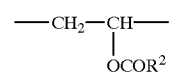

D is present in an amount of 1 to 70 mole % of the binder and is selected from the group consisting of:

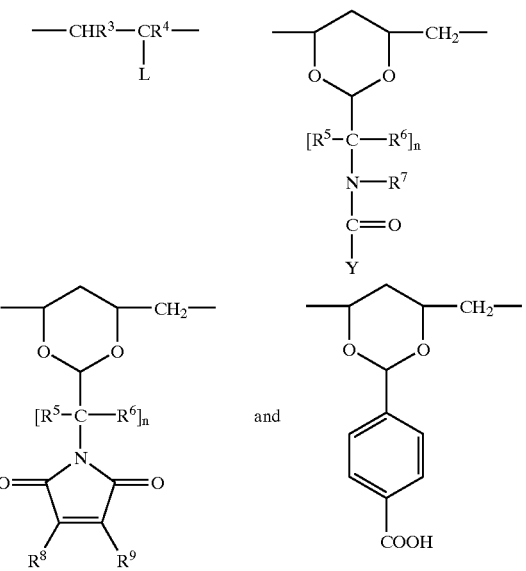

wherein
- $R^1$ represents a hydrogen atom, alkyl group, aryl group or alkenyl group,
- $R^2$ represents a hydrogen atom or alkyl group,
- $R^3$ and $R^4$ are independently selected from a hydrogen atom or an alkyl group;
- L represents either the group —NH CO—$R^{12}$ —CO—NH—$R^{13}$, wherein $R^{12}$ is selected from a hydrogen atom, an alkyl group, an alkenyl group, or an acryl group, optionally substituted by a carboxyl group, and $R^{13}$ is a $C_1$–$C_6$ hydrocarbon group, optionally substituted by one or more hydroxyl, $C_1$–$C_3$ ether or amino, mono $C_1$–$C_3$ alkyl amino, di-$C_1$–$C_3$ alkylamino or carboxyl groups, or an aryl group having at least one carboxyl or sulfonic acid group, $R^5$ and $R^6$ are independently selected from a hydrogen atom and an alkyl group and n is an integer from 1 to 3, $R^7$ is selected from an alkyl group, aryl group or alkenyl group, $R^8$ and $R^9$ are independently selected from a hydrogen atom or an alkyl group, or $R^8$ and $R^9$, together with the two carbon atoms they are attached to, represent a 5 or 6 membered carbocyclic ring, Y is selected from the group consisting of OC—Z—COOR$^{10}$ and SO$_2$R$^{11}$, $R^{10}$ is selected from a hydrogen atom or an alkyl group, $R^{11}$ is selected from an alkyl group, an alkenyl group or an aryl group, and Z is a saturated or unsaturated chain or ring-shaped spacer group;

(b) delivering radiation imagewise to the precursor;

(c) developing the precursor in a developer to selectively remove the image-forming layer in regions in which the radiation was not delivered image-wise in step (b); and (d) contacting the image-wise exposed precursor with a relief-treatment material, to selectively relief-treat regions of the surface of the precursor in which the image-forming layer was removed on development in step (c).

3. The method according to claim 2, in which the relief-treatment is etching and the relief-treatment material is an etchant.

4. The method according to claim 2, in which the relief-treatment is electrodeposition and the relief-treatment is an electrodeposition material.

5. The method according to claim 2, in which the binder comprises two or more different units of formula (A), wherein in each unit of formula (A), $R^1$ is independently selected from a hydrogen atom, an alkyl group, an aryl group or alkyenyl group, and wherein the total amount of units (A) present in the binder is 5 to 80 mole %.

6. The method according to claim 1 wherein the binder comprises a polymer selected from the group consisting of:

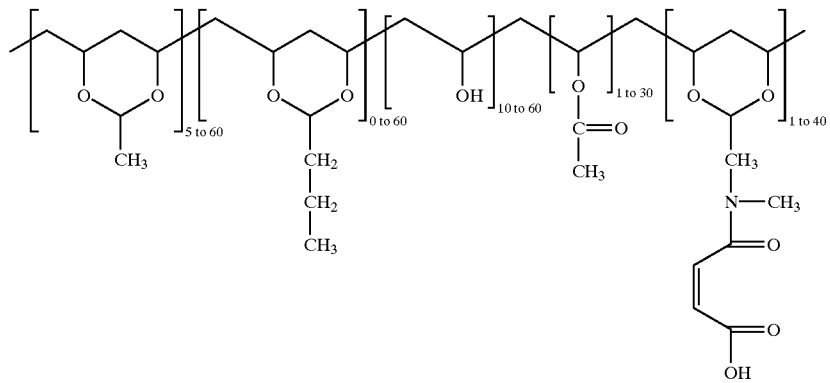

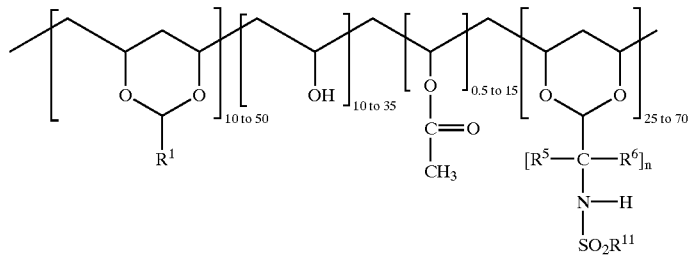

where n=1–3,

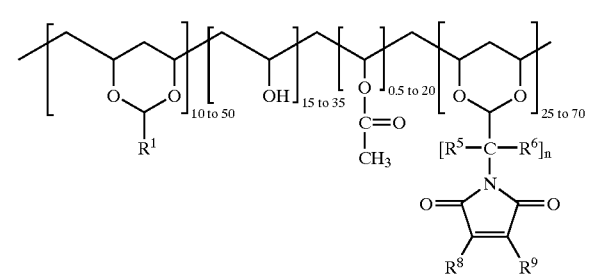

where n=1–3,

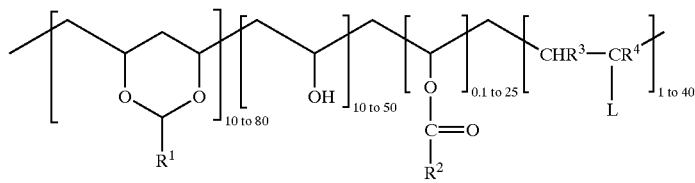

and

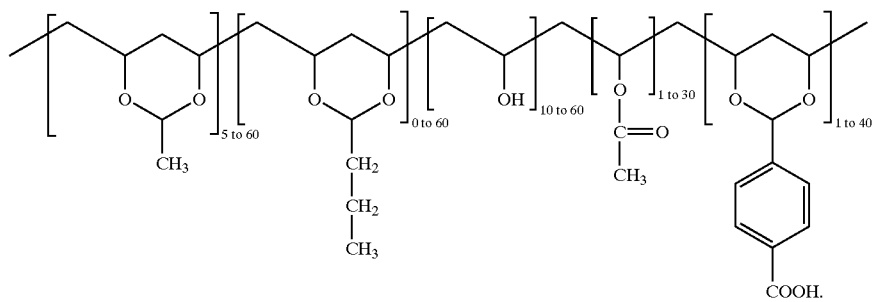

7. The method according to claim 2 wherein the binder comprises:

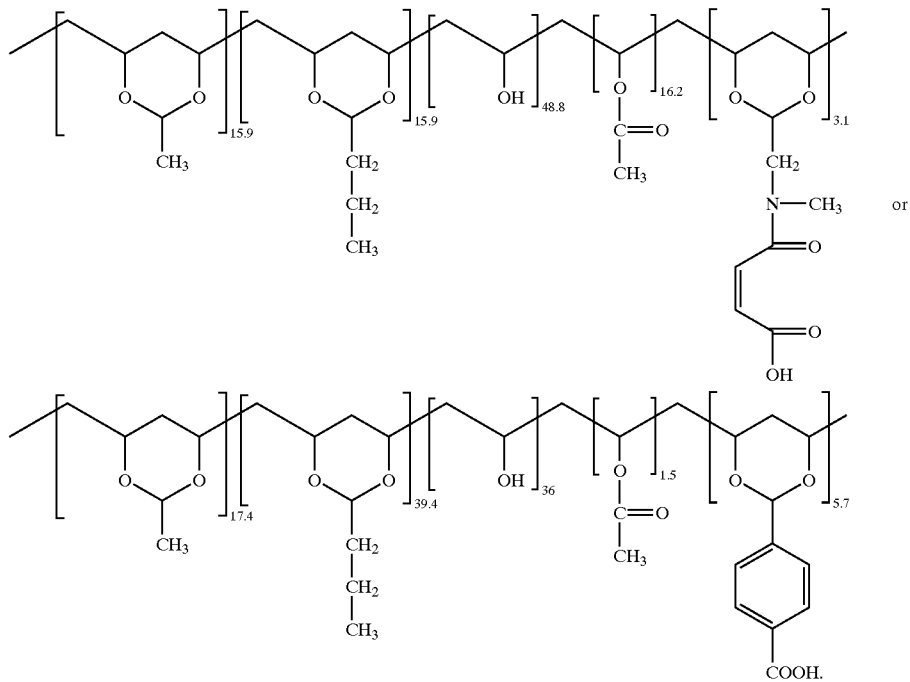

8. The method according to claim 2 wherein the precursor to the imaged member is a precursor to a letterpress printing form.

9. The method according to claim 8 wherein the surface of the letterpress printing form precursor is a metal or metal alloy surface.

10. The method according to claim 9 wherein the metal surface is a magnesium surface, a copper surface, zinc surface, steel surface or a copper alloy surface.

11. The method according to claim 2 wherein the imaged member precursor is an electronic part precursor.

12. The method according to claim 12 wherein the polymerizable material is a diazonium polycondensation product of a free radical polymerizable system comprising at least one photoinitiator and at least one unsaturated compound which is free radical polymerizable, or a combination thereof.

13. The method according to claim 12 wherein the polymerizable material is a diazonium polycondensation product comprising a reaction product of a diazonium salt with formaldehyde or 4,4'-bis-methoxymethyl diphenyl ether.

14. The method according to claim 12 wherein the polymerizable material is a diazonium polyconsdensation product present in the photosensitive composition in an amount of 3 to 60 wt %.

15. The method according to claim 12, wherein the photo polymerizable material is a free radical polymerizable system at least one photoinitiator and at least one unsaturated compound which is free radical polymerizable, wherein the photoinitiator absorbs in the range 300 nm to 800 nm.

16. The method according to claim 15 wherein the photoinitator is selected from the group consisting of acetophenone, benzophenone, 1,3,5-(trichloromethyl)-triazine, benzoine, benzoine ethers, benzoine ketals, xanthone, thiozanthone, acridine and hexaryl-bis-imidazole.

17. The method according to claim 12, wherein the polymerizable material is a free radical polymerizable system comprising at least one photoinitiator and at least one unsaturated compound which is free radical polymerizable, wherein the free radical polymerizable unsaturated compound is a acrylic or methyacrylic derivate having one or more unsaturated groups.

18. The method according to claim 2, wherein the photosensitive composition further comprises one or more exposure indicators.

19. The method according to claim 2 wherein the photosensitive composition further comprises a colorant.

20. The method according to claim 2, wherein the photosensitive composition further comprises one or more stabilizing acids.

21. The method according to claim 2 wherein the photosensitive composition further comprises one or more softening agents.

22. The method according to claim 21 wherein a softening agent is dibutylphthalate, triaryl phosphate or dioctylphthalate.

23. The method according to claim 2 wherein the photosensitive composition further comprises a siloxane material.

24. The method according to claim 2 wherein the radiation used to expose the precursor is visible radiation, UV radiation, or a combination thereof.

25. The method according to claim 24 wherein the radiation used to expose the precursor is of wavelength between 450 nm and 800 nm.

26. The method according to claim 3 wherein the etchant is a solution of ferric chloride, cupric chloride or ammonium persulfate.

27. The method according to claim 2 further comprising the step of removing the remaining regions of the coating after relief-treatment.

28. The method according to claim 27 wherein the remaining regions of the coating are removed using a stripper liquid.

* * * * *